United States Patent
Woodley et al.

(10) Patent No.: US 11,729,906 B2
(45) Date of Patent: Aug. 15, 2023

(54) PRINTED CIRCUIT BOARD WITH INTEGRATED FUSING AND ARC SUPPRESSION

(71) Applicant: Eaton Intelligent Power Limited, Dublin (IE)

(72) Inventors: Kaijam M. Woodley, Brown Deer, WI (US); Michael K. Balck, Wauwatosa, WI (US); Matthew J. Koebert, Menomonee Falls, WI (US)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 16/702,723

(22) Filed: Dec. 4, 2019

(65) Prior Publication Data
US 2020/0196442 A1 Jun. 18, 2020

Related U.S. Application Data

(60) Provisional application No. 62/778,391, filed on Dec. 12, 2018.

(51) Int. Cl.
| | |
|---|---|
| *H01H 85/08* | (2006.01) |
| *H05K 1/02* | (2006.01) |
| *H01H 85/046* | (2006.01) |
| *H01H 85/02* | (2006.01) |
| *H01H 69/02* | (2006.01) |
| *H01H 85/10* | (2006.01) |

(52) U.S. Cl.
CPC ......... *H05K 1/0293* (2013.01); *H01H 69/022* (2013.01); *H01H 85/0241* (2013.01); *H01H 85/046* (2013.01); *H01H 85/08* (2013.01); *H01H 85/10* (2013.01); *H01H 2085/0275* (2013.01); *H05K 2201/10181* (2013.01)

(58) Field of Classification Search
CPC .... H01H 69/022; H01H 85/046; H01H 85/08; H01H 85/10; H01H 85/38; H01H 2085/0275; H01H 2085/381; H05K 2201/10181
See application file for complete search history.

(56) References Cited

U.S. PATENT DOCUMENTS

| | | | |
|---|---|---|---|
| 5,027,101 A * | 6/1991 | Morrill, Jr. ........ | H01H 85/0411 337/273 |
| 5,777,540 A * | 7/1998 | Dedert ................. | H01H 85/143 257/665 |
| 5,883,562 A | 3/1999 | Matsuoka et al. | |
| 5,923,239 A * | 7/1999 | Krueger ............... | H01H 69/022 337/297 |

(Continued)

*Primary Examiner* — Jacob R Crum
(74) *Attorney, Agent, or Firm* — DiBerardino McGovern IP Group LLC

(57) ABSTRACT

A circuit board with integrated fusing includes an insulating substrate having a circuit trace formed on a surface thereof, the circuit trace including a first circuit trace portion and a second circuit trace portion. A fusible link electrically connects the first circuit trace portion to the second circuit trace portion, the fusible link including a planar surface extending from the first circuit trace portion to the second circuit trace portion. A dielectric reflow encapsulates the fusible link on the planar surface from the first circuit trace portion to the second circuit trace portion.

20 Claims, 6 Drawing Sheets

(56) References Cited

U.S. PATENT DOCUMENTS

| | | | | |
|---|---|---|---|---|
| 6,002,564 | A * | 12/1999 | Ohtsuchi | H01H 85/048 |
| | | | | 361/103 |
| 6,043,966 | A | 3/2000 | Krueger et al. | |
| 2002/0097134 | A1* | 7/2002 | Martin | H01H 85/046 |
| | | | | 337/297 |
| 2003/0048620 | A1* | 3/2003 | Nishimura | H05K 1/0293 |
| | | | | 361/760 |
| 2004/0169578 | A1* | 9/2004 | Jollenbeck | H01H 85/046 |
| | | | | 337/227 |
| 2004/0189436 | A1* | 9/2004 | Hill | H05K 1/0293 |
| | | | | 337/297 |
| 2005/0141164 | A1* | 6/2005 | Bender | H01H 85/0047 |
| | | | | 361/104 |
| 2007/0062031 | A1* | 3/2007 | Kamp | H05K 1/0293 |
| | | | | 29/739 |
| 2008/0191832 | A1* | 8/2008 | Tsai | H01H 85/046 |
| | | | | 337/297 |
| 2012/0103930 | A1* | 5/2012 | Zhou | H01H 69/022 |
| | | | | 216/13 |
| 2019/0189382 | A1* | 6/2019 | Holland | H01H 85/046 |

\* cited by examiner

PRINTED CIRCUIT BOARD WITH INTEGRATED FUSING AND ARC SUPPRESSION

CROSS-REFERENCE TO RELATED APPLICATIONS

The present invention claims priority to U.S. Provisional Patent Application Ser. No. 62/778,391 filed Dec. 12, 2018, the disclosure of which is incorporated herein by reference in its entirety.

BACKGROUND OF THE INVENTION

Printed circuit boards typically interconnect electronic components using conductive traces to form circuit modules or assemblies. The printed circuit boards often have a laminar construction with a conductive layer attached to an electrically insulative layer via an adhesive layer. Various etching techniques can be used to remove portions of the conductive layer and form conductive traces that define a desired circuit geometry. The electronic components often comprise discrete surface-mounted devices that are commonly soldered or electrically connected to the conductive traces, or thin film devices directly integrated into the conductive traces. The printed circuit board may include a single layered board with electrical components mounted to one or two surfaces of the board, or a multi-layered board with electrical components mounted on or between layers that are vertically stacked. In either case, integrating electronic components directly into a conductive trace can reduce size requirements of the printed circuit board.

Many printed circuit board applications require electrical fuses coupled to the electrical circuitry of the board. The electrical fuses can interrupt an electrical connection in the electrical circuitry upon receiving an electrical overage (e.g., an overload current or a short-circuit current). Unfortunately, discrete surface-mounted fuses can require significant height and surface area that can interfere with size requirements of the printed circuit board. Further, techniques that form electrical components directly into the printed circuit board can be complex and expensive. For instance, some electrical components cannot be conveniently formed within existing processing steps of the printed circuit board, increasing time and expense during manufacturing. Accordingly, a convenient method of forming electrical fuses on a printed circuit board that minimizes space requirements and cost is needed.

Further, electrical fuses for printed circuit boards are often susceptible to open circuit arcing. Resistive heating across a fuse element in an electrical fuse heats the fuse element to its thermal melting point, which blows the fuse and can vaporize a portion of the fuse element. While the vapor dissipates, an arc discharge often results across the fuse element in the vapor. Thus, a current is produced across the fuse until the arc discharge fades such that the blown fuse does not immediately interrupt the flow of current. In high voltage or high current applications, the arc discharge may dissipate slowly and may remain a concern after the vapor dissipates. Further, a voltage spike resulting from the arc discharge may damage electrical components of electrical devices using the printed circuit board.

Therefore, it would be desirable to provide a printed circuit board with integrated fusing that minimizes manufacturing complexity. Further, it would be desirable to provide a printed circuit board having integrated fusing with arc suppression to prevent open circuit arcing.

BRIEF DESCRIPTION OF THE INVENTION

In accordance with one aspect of the invention, a circuit board with integrated fusing includes an insulating substrate having a circuit trace formed on a surface thereof, the circuit trace including a first circuit trace portion and a second circuit trace portion. A fusible link electrically connects the first circuit trace portion to the second circuit trace portion, the fusible link including a planar surface extending from the first circuit trace portion to the second circuit trace portion. A dielectric reflow encapsulates the fusible link on the planar surface from the first circuit trace portion to the second circuit trace portion.

In accordance with another aspect of the invention, a circuit board with integrated fusing includes an electrically insulating substrate, a conductive trace formed on the electrically insulating substrate to form an electrical circuit, and one or more fuse elements positioned in the conductive trace. Each of the one or more fuse elements may be configured to open the electrical circuit upon receiving an electrical overage. A dielectric encapsulant is positioned about each of the one or more fuse elements to prevent open circuit arcing by reflow into a respective open fuse element.

In accordance with yet another aspect of the invention, a method of forming a printed circuit board includes providing an electrically insulating substrate having a conductive trace substrate on a first surface thereof, and etching the conductive trace substrate to form a circuit trace with at least one fusible link in the circuit trace. Each of the at least one fusible link includes a portion of the circuit trace having a reduced cross-sectional area from a first end to a second end of the respective fusible link. The method also includes applying a dielectric on the circuit trace so as to encapsulate each of the at least one fusible link from the first end to the second end.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENT

The operating environment of the invention is described with respect to a printed circuit board having integrated fusing. While the invention will be described with respect to a printed circuit board having planar fusing formed internal to a circuit trace, embodiments of the invention are equally applicable for use with a printed circuit board having planar fusing formed external to a circuit trace.

Figure 1:
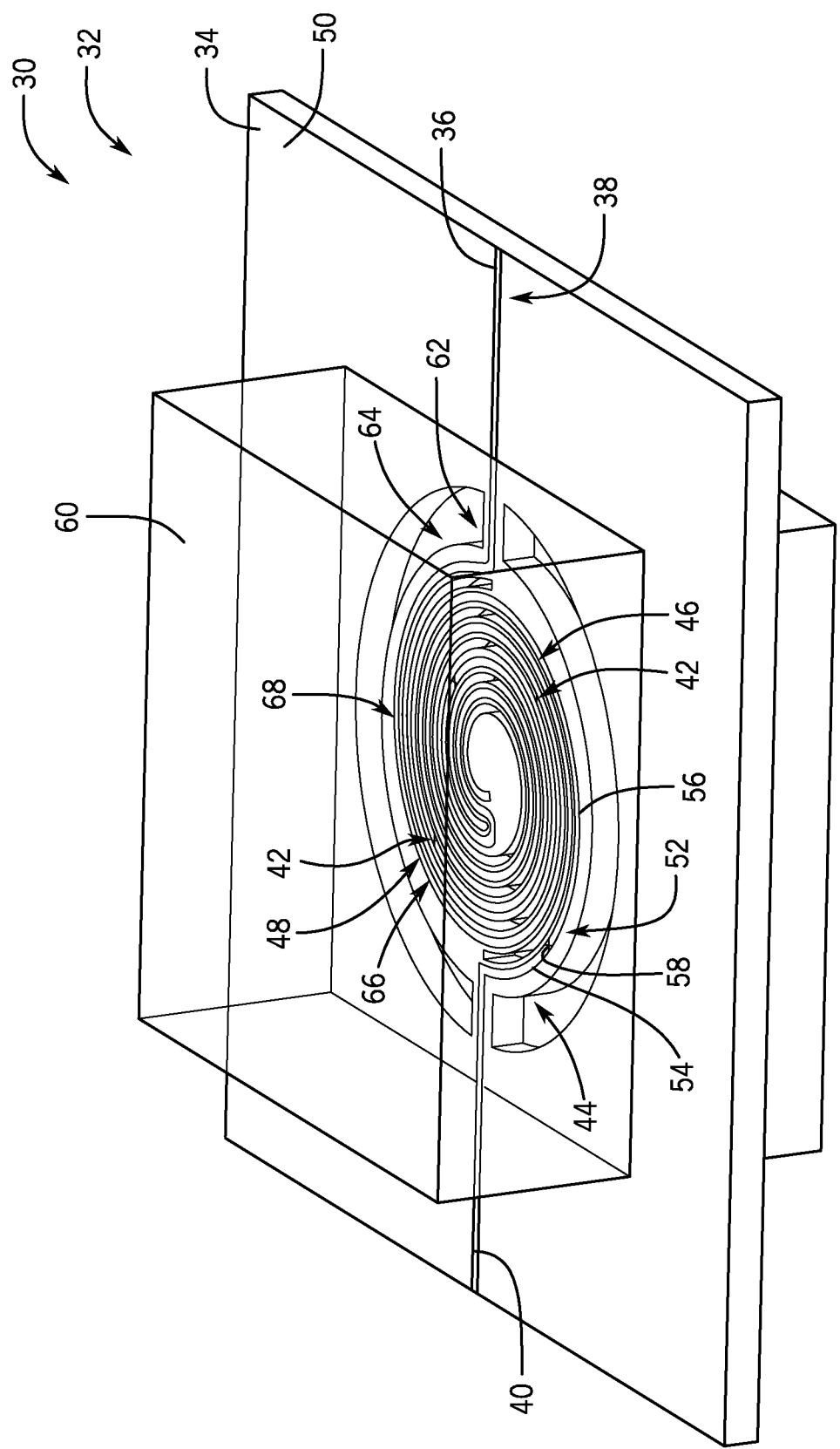
FIG. 1 is a perspective view of an electrical device having integrated fuse protection, according to an embodiment of the invention.

Referring now to FIG. 1, an electrical device 30 having integrated fuse protection is shown, in accordance with an embodiment of the invention. The electrical device 30 preferably includes a printed circuit board 32 having a laminar construction that includes an electrically insulating substrate 34, a conductive layer 36, and an adhesive layer 38 binding the conductive layer to the electrically insulating substrate. A conductive trace geometry 40, also referred to as a circuit trace, may be etched into the conductive layer 36 to electrically interconnect electrical components mounted to the printed circuit board. In a preferred embodiment, one or more fusible links 42, also referred to as fuse element or electric fuses, are etched into the conductive trace 40 to provide internal planar film fusing for the electrical device 30. The electrical device 30 may have a modular configuration that provides a replaceable interconnect device for a printed circuit board assembly. Accordingly, the electrical device 30 may provide a circuit card offering in-line fused short-circuit protection for a product using the printed circuit board assembly.

In one embodiment of the invention, the electrically insulating substrate 34 is preferably formed from FR4 epoxy, although the electrically insulating substrate 34 could be formed from glass epoxy, ceramic, electrically insulating polymers, or any other suitable material. The conductive trace 40 forms one or more electrical circuits 44 on or within the electrically insulating substrate 34 to electrically connect electronic components 46 coupled to the printed circuit board 32. In one embodiment of the invention, the conductive trace 40 forms a plurality of circuit trace portions 48 etched on a first surface 50 of the electrically insulating substrate 34. The electronic components 46 may include one or more fusible links 42 formed in the conductive trace 40 each electrically connecting a pair of circuit trace portions 48.

The electric fuse 42 may be formed by etching the conductive trace 40 to a reduced cross-sectional area forming fusible links 42 separating two adjacent circuit trace portions 48. Each fusible link 42 is configured to open an electrical connection between the adjacent pair of circuit trace portions 48, thus providing fuse protection for the electrical circuit 44. As shown, a fusible link 52 electrically connects a first circuit trace portion 54 to a second circuit trace portion 56. The fusible link 52 may include a planar surface 58 extending from the first circuit trace portion 54 to the second circuit trace portion 56. A dielectric encapsulant 60, also referred to as a dielectric reflow, may be applied over the conductive trace 40 to provide protection and electrical isolation to components on the electrically insulating substrate 34. As such, a dielectric encapsulant 60 can encapsulate the fusible link 52 on the planar surface 58 from the first circuit trace portion 54 to the second circuit trace portion 56, thus providing a printed circuit board 32 with integrated planar fusing.

The conductive trace 40 can be routed on or through the electrically insulating substrate 34 to form a desired electrical circuit pattern for the electrical device 30. For instance, the plurality of circuit trace portions 48 can be routed on or through the electrically insulating substrate 34 to electrically connect various electrical components 46 mounted on the printed circuit board 32 (e.g. fusible links 42 or other electrical components). The plurality of circuit trace portions 48 may be routed into one or more isolation regions 62 of the printed circuit board 32, e.g. regions that may be surrounded by one or more isolation gaps 64 formed through the electrically insulating substrate 34. The conductive trace 40 is shown routed into an isolation region 62 on the electrically insulating substrate 34, with the conductive trace 40 having a non-linear pattern 66 formed within the isolation region 62. The non-linear pattern 66 of the conductive trace 40 may form a plurality of parallel curves routed within the isolation region 62 that are closely spaced and adjacent to form a spiral pattern 68 that allows a greater length of the conductive trace 40, with integrated fuses 42 routed into the isolation region 62.

Figure 2:
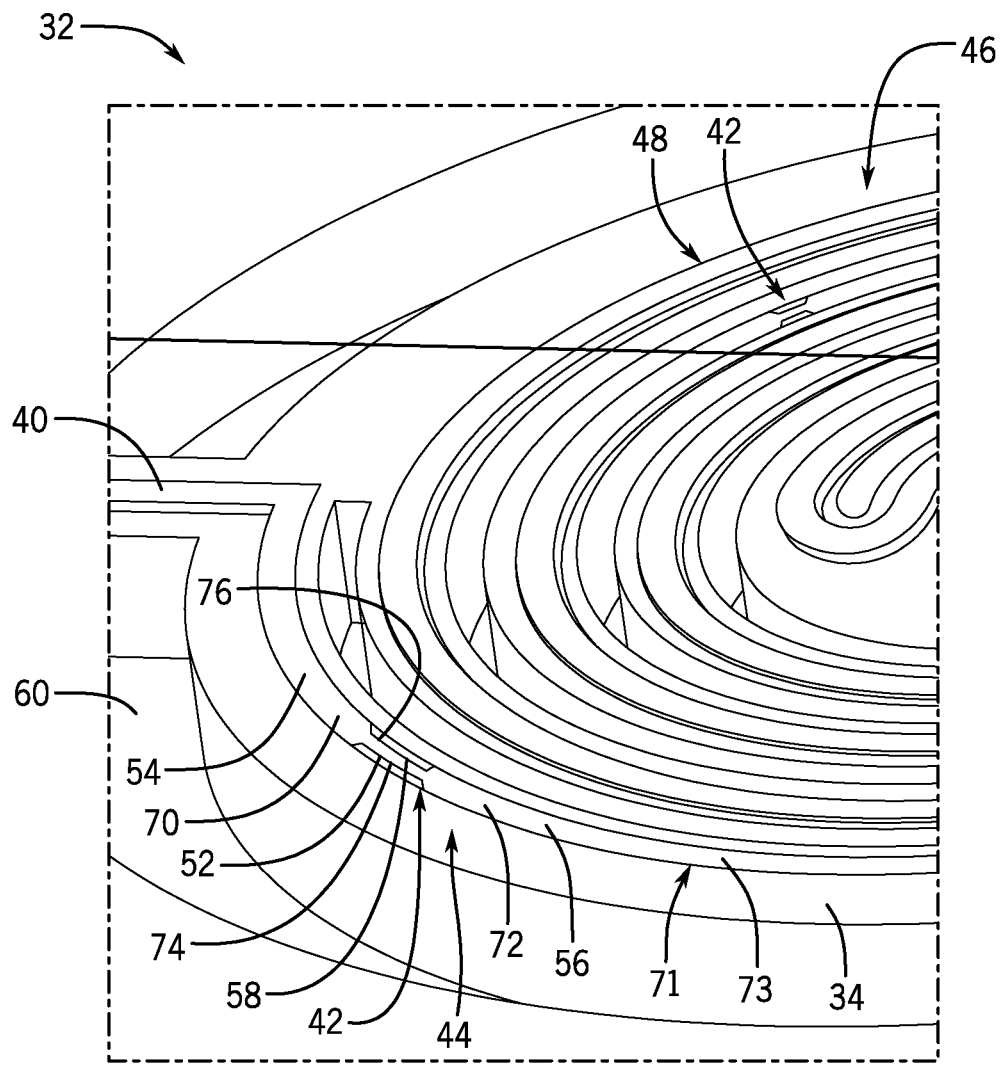
FIG. 2 is a detail view of a portion of the electrical device of FIG. 1 about a fuse element coupled between two circuit traces, according to an embodiment of the invention.

Referring now to FIG. 2, a detailed partial perspective view of a portion of the electrical device 30 of FIG. 1 is shown to better illustrate features thereof. FIG. 2 shows multiple fusible links 42 formed in the conductive trace 40 with each fusible link electrically connecting a respective pair of circuit trace portions 48, thus forming electrical circuits 44 with integrated fusing. Accordingly, a fusible link 52 is formed between the first circuit trace portion 54 and the second circuit trace portion 56 to form an electrical circuit 44. The fusible link 52 is configured to open the electrical circuit 44 between the first circuit trace portion 54 and the second circuit trace portion 56 responsive to an electrical overage in the electrical circuit 44. The fusible link 52 may have a lower current rating for thermal-electrical breakdown than adjacent circuit trace portions 54, 56 such that the fusible link 52 opens due to resistive heating caused by an electrical overage in the electrical circuit 44, e.g. an overload current or a short-circuit current in the electrical device 30 (FIG. 1).

As stated above, the fusible link 52 may be formed in the conductive trace 40 by etching. The fusible link 52 preferably has a smaller cross-sectional area than both the first circuit trace portion 54 and the second circuit trace portion 56 taken in a direction perpendicular to current flow in the electrical circuit 44. The smaller cross-sectional area gives the fusible link 52 a lower current rating for thermal-electrical breakdown than the circuit traces 54, 56 providing a thermal weak point in the electrical circuit 44. In other embodiments of the invention, the fusible link 52 may be formed from a material alternate from that of the adjacent circuit traces 54, 56, e.g. a weaker electrical grade of copper or copper alloy, to provide the thermal weak point. The fusible link 52 could be made from a material having a lower thermal melting temperature than the circuit trace portions 54, 56, and could be formed by joining together two or more materials. In some embodiments of the invention, the fusible link 52 may be formed from a material different than the circuit traces 54, 56 and have a smaller cross-sectional area.

Each fusible link 52 may be formed having the planar surface 58 positioned on a side of the fusible link 52 opposite the insulating substrate 34 (i.e., a top surface of the fusible link 52). As stated above, the fusible link 52 may be formed by etching a section of the conductive trace 40 to have a reduced cross-sectional area, and therefore the planar surface 58 of the fuse element may be aligned planarly with a surface of each of the adjacent circuit trace portions 54, 56. The planar surface 58 of the fusible link 52 may be planar to a surface 70, 72 of each of the first circuit trace portion 54 and the second circuit trace portion 56, although the planar surface may be planar to a surface of only one or neither of the first circuit trace and the second circuit trace. If the conductive trace 40 is formed from a copper lamination, the conductive trace could have opposing first and second flat surfaces 71, 73 with the first flat surface 71 coupled to the electrically insulating substrate 34. The second flat surface 73 could form a planar surface 58 of a fusible link 52 etched into the conductive trace 40.

In other embodiments of the invention, the fusible link 52 may have a planar surface 58 positioned within the perimeter of the adjacent circuit trace portions 54, 56 or positioned outside the perimeter of the adjacent circuit trace portions. The fusible link 52 may be formed with the planar surface 58 extending outwards beyond the outer periphery of each circuit trace portion 54, 56 with one or more sides 74, 76 of the fusible link positioned within the outer periphery of each circuit trace portion 54, 56. The outer periphery of the fusible link 52 may be formed entirely internal to the periphery of the adjacent circuit trace portions 54, 56. Alternatively, the fusible link 52 may be formed with an outer periphery entirely outside the periphery of the adjacent circuit trace portions 54, 56.

The dielectric reflow 60 may be applied on the fusible link 52 to prevent arcing from the first circuit trace portion 54 to the second circuit trace portion 56. The dielectric reflow 60 may comprise an epoxy resin-based high dielectric potting material. In a preferred embodiment, the dielectric reflow 60 may be formed on the planar surface 58 of the fusible link 52 from the first circuit trace portion 54 to the second circuit trace portion 56 to encapsulate the fusible link on the electrically insulating substrate 34. The dielectric reflow 60 can flow around an open fusible link 52 (i.e., a blown fuse) to prevent open circuit arcing between the first circuit trace portion 54 and the second circuit trace portion 56. That is, the dielectric reflow 60 is preferably applied on the planar surface 58 of the fusible link 52 to flow into an opened fuse link. The fusible link 52 may be encapsulated by the dielectric reflow 60 to flow into an opened fuse element, preventing open circuit arcing.

It is recognized that integrated fusing may be used in low voltage applications below 50 volts where opening the fuse is desired in an overcurrent event that thermally clears the fuse element. In low voltage applications, the electric isolation across the fuse may be provided by the photoresist coating, internal substrate material, and the fuse link element. However, in higher voltage applications arcing may remain a concern. That is, when the fuse element thermally melts it may maintain a potential to create a voltage arc over the standard PCBA substrate material in instances when the apparent voltage is high enough after the fuse has cleared in an over current event. While integrated fusing may be used in low voltage applications up to 50 volts, the dielectric reflow 60 may prevent open circuit arcing across the fusible link 52 up to 600 volts. The dielectric reflow 60 can also be applied over larger areas of the printed circuit board 32 to protect electronic components 46 from impact and oxidation.

Figure 3:
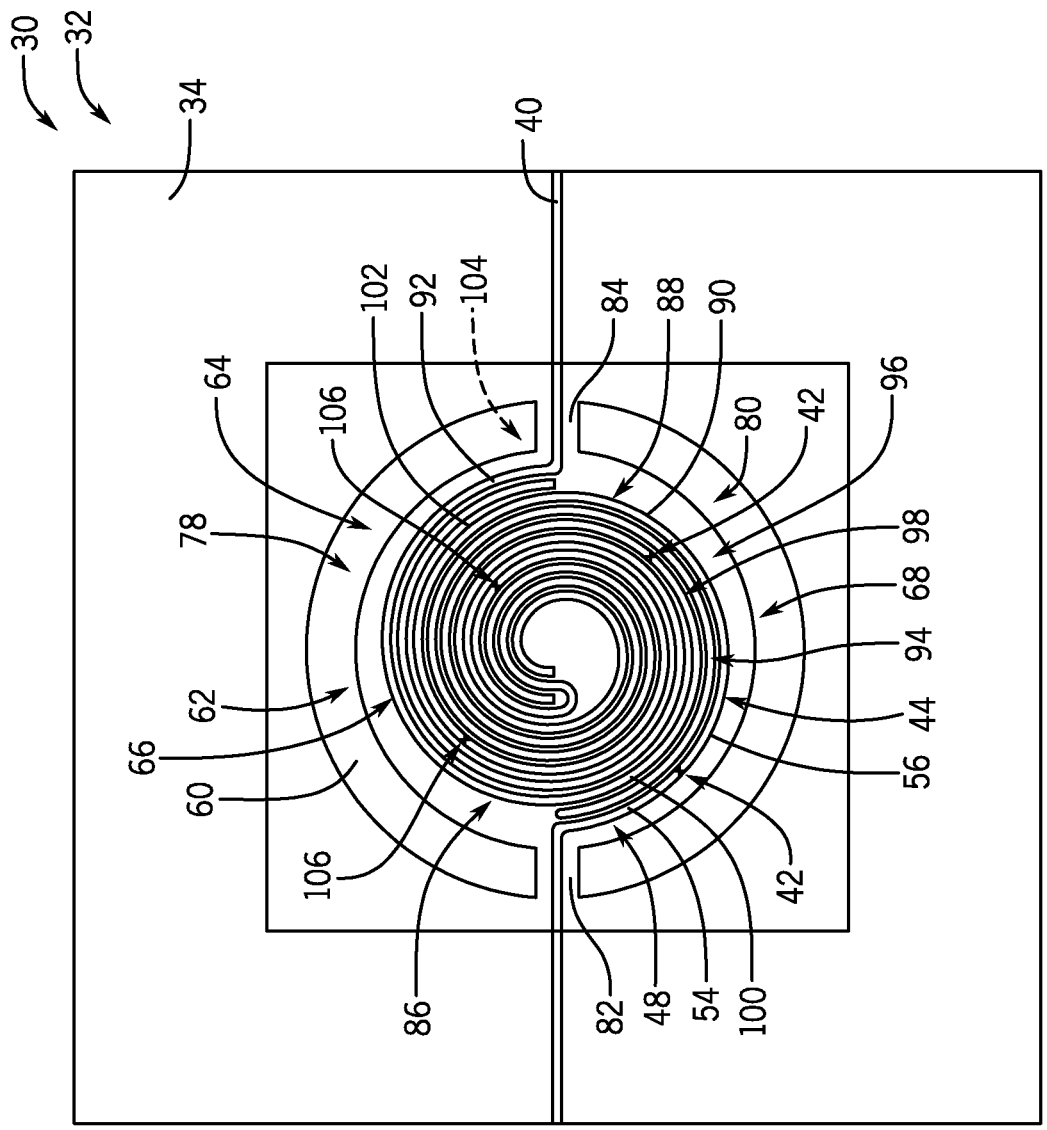
FIG. 3 is a side view of the electrical device of FIG. 1 and facing an insulating substrate having a conductive trace with integrated planar fusing and a dielectric encapsulant thereon, according to an embodiment of the invention.

Referring now to FIG. 3, the printed circuit board 32 is shown at a direction facing a surface of the electrically insulating substrate 34 having the conductive trace 40 thereon, in accordance with an embodiment of the invention.

As referred to previously, a conductive trace 40 may be formed on or through the electrically insulating substrate 34 to form an electrical circuit 44. One or more fuse elements 42 may be positioned in the conductive trace 40, each of the one or more fuse elements 42 configured to open the electrical circuit 44 upon receiving an electrical overage. A dielectric encapsulant 60 is preferably positioned about each of the one or more fuse elements 42 to prevent open circuit arcing by reflow into a respective open fuse element. Accordingly, the electrical device 30 comprises integrated arcless fusing.

The conductive trace 40 is shown routed into a circular isolation region 62 on the printed circuit board 32. The isolation region 62 may be formed by a first isolation gap 78 and a second isolation gap 80 that each comprise semicircular slots formed through the electrically insulating substrate 34 on opposite sides of the circular isolation region 62. The electrically insulating substrate 34 comprises a first bridge 82 and a second bridge 84 between the first and second isolation gaps 78, 80 to route the conductive trace 40 into the isolation region 62. The dielectric encapsulant 60 may extend into each of the one or more isolation gap openings 64 (e.g. first isolation gap 78, second isolation gap 80) to encapsulate the isolation region 62. The dielectric encapsulant 60 can be formed on the isolation region 62 and on surrounding adjacent portions of the electrically insulating substrate 34. As shown in FIG. 1, the dielectric encapsulant 60 can also extend through the one or more isolation gaps 64 to encapsulate a side of the isolation region 62 opposite the conductive trace 40 and the surrounding adjacent portions of the electrically insulating substrate 34.

Referring back to FIG. 3, a portion of the conductive trace 40 comprises a non-linear configuration 66, with a plurality of segments 86 of the portion arranged in an adjacent relationship to one another, and wherein the one or more fuse elements 42 comprise a plurality of fuse elements 106 positioned in the plurality of segments 86, the plurality of fuse elements 106 being serially arranged. The plurality of segments 86 of the conductive trace 40 are formed on or within an isolation region 62 of the electrically insulating substrate 34, the isolation region 62 substantially surrounded by one or more openings 64 (e.g. isolation gaps) formed in the electrically insulating substrate 34, with the conductive trace 40 routed into the isolation region 62. In one embodiment, the conductive trace 40 follows a spiral configuration 88 into and out of the center of the circular isolation region 62. That is, the conductive trace 40 has a first and a second spiral component 90, 92 that follows adjacent spiral paths into a center portion of the isolation region 62. The first spiral component 90 and the second spiral component 92 may each make approximately two circular loops that wrap around each other to connect in series in the center portion of the isolation region 62. The first spiral component 90 and the second spiral component 92 may form a plurality of parallel curves as they wrap around each other along the spiral configuration 88. Accordingly, the plurality of segments 86 of the conductive trace 40 may form a spiral portion 88 of the conductive trace.

One or more isolation gaps 94 may be formed in the electrically insulating substrate 34 and separate each of the plurality of segments 86 of the conductive trace 40. Isolation gaps 94 may each include a slot formed in/through the electrically insulating substrate 34 to separate two or more circuit trace portions 48, or may separate portions of a single circuit trace that wraps around an isolation gap. FIG. 3 shows an isolation gap 94 separating a first parallel curve 96 from a second parallel curve 98 of the conductive trace 40 located within an isolation region 62. Each of the plurality of parallel curves may be separated by an isolation gap 94 formed between a pair of adjacent parallel curves. The conductive trace 40 may be routed around one or more isolation gaps 94 such that circuit trace portions 48 separated by the isolation gaps 94 are coupled in series. For instance, the first parallel curve 96 includes a first circuit trace portion 54 and a second circuit trace portion 56 coupled in series to a third circuit trace portion 100 of the second parallel curve 98. Isolation gaps 94 may be formed between circuit trace portions that are coupled in parallel or between circuit trace portions that are not electrically connected.

The dielectric encapsulant 60 preferably covers the non-linear portion 66 of the conductive trace 40. The dielectric encapsulant 60 may extend into each isolation gap 94 within the isolation region 62 to form a dielectric barrier between the plurality of segments 86. That is, the dielectric encapsulant 60 can extend through each isolation gap 94 to encapsulate the conductive trace 40 along the plurality of parallel curves 68. The plurality of circuit trace portions 48 may be formed on the electrically insulating substrate 34 spaced slightly apart from adjacent isolation gaps 94, creating a ledge 102 on the electrically insulating substrate 34 to support the dielectric encapsulant 60 between the respective circuit trace portion and the isolation gaps 94. The dielectric encapsulant 60 can also extend through the isolation gaps 94 to encapsulate a side 104 of the isolation region 62 opposite the conductive trace 40. The dielectric encapsulant 60 may cover a plurality of fuse elements 106 formed in the plurality of parallel curves, with the parallel curves arranged in an adjacent closely spaced relationship to minimize an area of the electrically insulating substrate 34 covered with the dielectric encapsulant 60.

Figure 4:
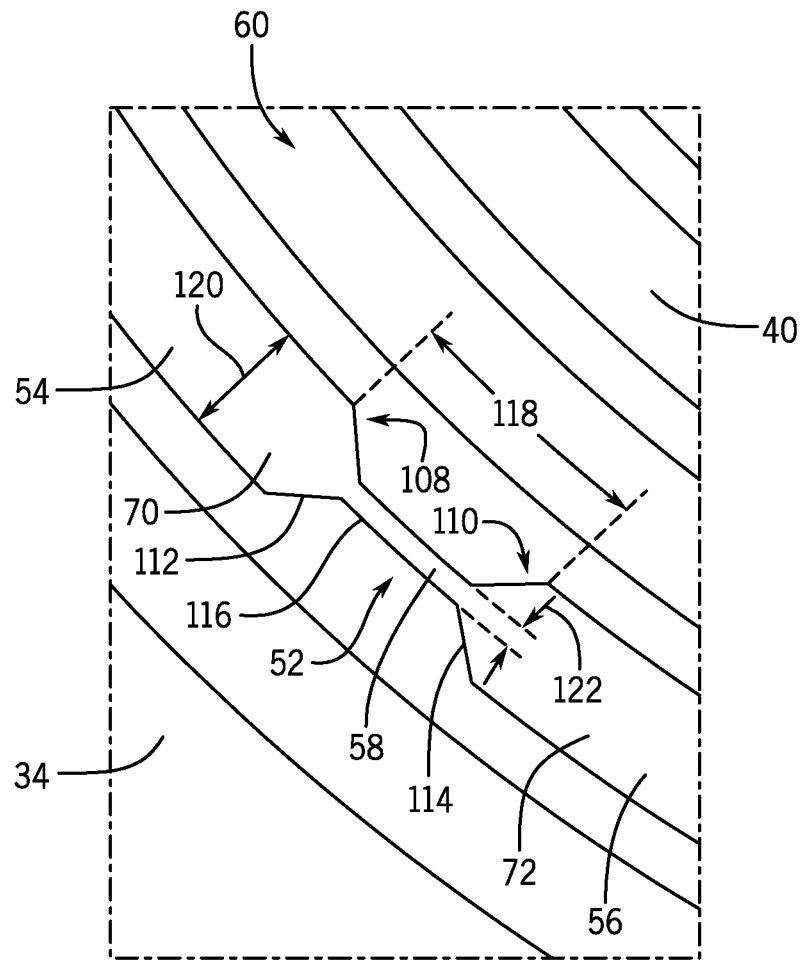
FIG. 4 is a detailed view of a portion of the electrical device of FIG. 3 about a fuse element incorporated into the conductive trace, according to an embodiment of the invention.

Referring now to FIG. 4, a detailed view of the electrical device 30 of FIG. 3 shows a fuse element 52 incorporated into the conductive trace 40 on the electrically insulating substrate 34, in accordance with an embodiment of the invention. FIG. 4 also shows the fuse element 52 comprising a planar surface 58 opposite the electrically insulating substrate 34 and aligned with surfaces 70, 72 respectively of the first circuit trace portion 54 and the second circuit trace portion 56. In one embodiment, each fuse element 52 may have a planar top surface 58, and each planar top surface 58 may be arranged planar with the conductive trace 40. The planar top surface 58 of each fuse element 52 extends along the conductive trace 40 from a first end 108 to an opposing second end 110 of the respective fuse element, the dielectric encapsulant 60 formed on each planar surface 58 from the first end 108 to the second end 110 of the respective fuse element.

The fuse element 52 may be etched into the conductive trace 40 with tapered portions 112, 114 at opposite ends of the fuse element that connect each respective circuit trace portion 54, 56 to a thinner fusible link portion 116 of the fuse element. The thinner fusible link portion 116 may follow a straight or curved path corresponding to the conductive trace 40, or could follow a straight path even in a curved portion of the conductive trace geometry. FIG. 4 shows an embodiment of the fuse element 52 having a length 118 approximately twice the width 120 of the conductive trace 40 and a width 122 approximately one fifth the width of the circuit trace. However, the dimensions of the fuse element 52 may vary according to the desired rating and application of the fuse and electrical device 30 (FIG. 3). For instance, the length 118 and the width 122 of the fuse element 52 may equal any suitable fraction or multiple of the conductive trace width 120 (e.g. 0.25×, 0.5×, 0.75×, 1×, 1.5× 2×, etc.).

Figure 5:
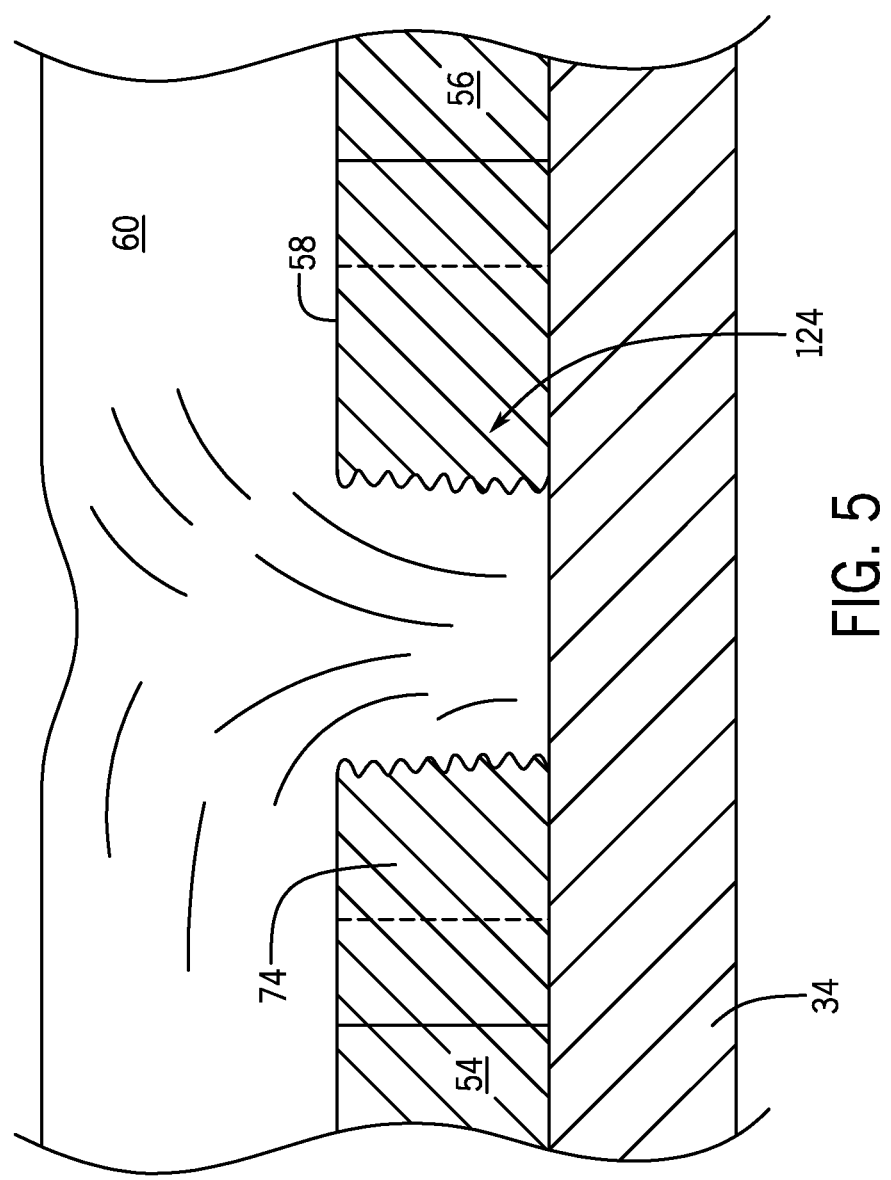
FIG. 5 is a cross-sectional view of a printed circuit board having an opened arcless fuse, according to an embodiment of the invention.

Referring now to FIG. 5, a cross-sectional view of an opened arcless fuse 124 taken perpendicular to the electrically insulating substrate 34 is shown, in accordance with an embodiment of the invention. The dielectric reflow 60 preferably encapsulates the fusible link 124 to prevent open circuit arcing between the first circuit trace portion 54 and the second circuit trace portion 56. The fusible link 124 is shown as a blown fuse 124 that has opened to interrupt an electrical connection between the first circuit trace portion 54 and the second circuit trace portion 56. The fusible link 124 is configured to open due to resistive heating resulting from an electrical overage. The dielectric reflow 60 flows into the open fusible link 124 to prevent open circuit arcing between the first circuit trace portion 54 and the second circuit trace portion 56. That is, the dielectric reflow 60 can flow around the opened fusible link 124 to separate the first circuit trace portion 54 from the second circuit trace portion 56. As the fusible link 124 approaches the thermal melting point, the fuse element may heat the dielectric reflow 60 such that it flows more easily into an opened fusible link 124.

The dielectric reflow 60 may be applied on the planar surface 58 of the fusible link 124 extending from the first circuit trace portion 54 to the second circuit trace portion 56. The dielectric reflow 60 may extend beyond the planar surface 58 on the first circuit trace portion 54 and/or the second circuit trace portion 56. While dielectric reflow 60 applied on the planar surface 58 may flow into an opened fusible link 124, dielectric reflow applied on the first and second circuit trace portion 54, 56 could flow into an opened fusible link 124. Alternatively, the dielectric reflow 60 may be applied to a portion of the planar surface 58 of the fusible link 124 such that another portion of the planar surface 58 remains uncovered. The dielectric reflow 60 may be applied on any one of the first side surface 74, the second side surface 76 (FIG. 2), the planar surface 58, or any combination thereof, to flow into an open fusible link 124 and prevent open circuit arcing. The dielectric reflow 60 may be applied on the first side surface 74 and the second side surface 76 (FIG. 2) of the fusible link 124 in addition to the planar surface 58 to encapsulate the fuse element.

Figure 6:
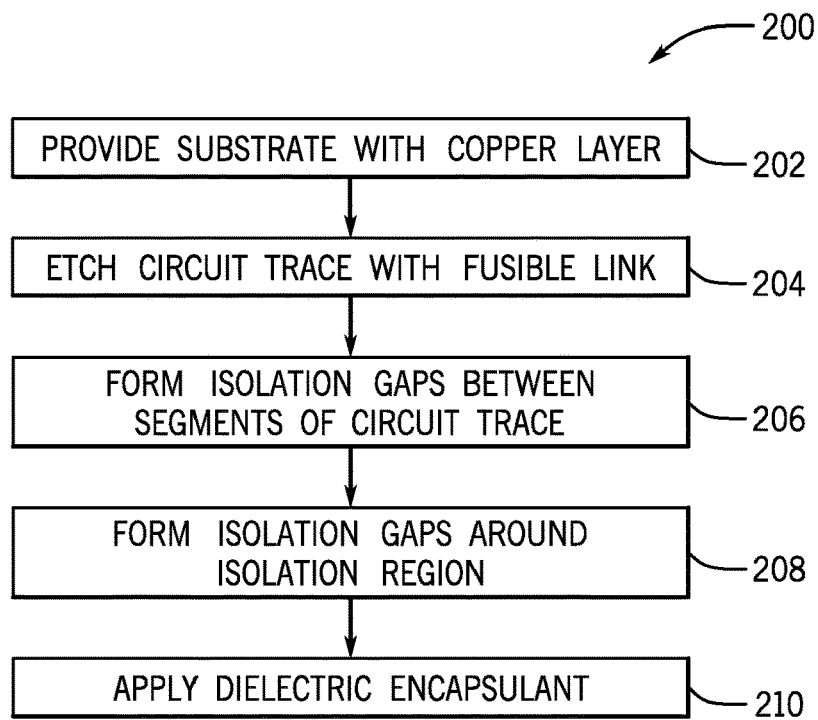
FIG. 6 is a flow chart showing steps in fabricating a printed circuit board having integrated fuse protection, according to an embodiment of the invention.

Referring now to FIG. 6, and with continued reference back to FIGS. 1-5, a flow diagram of a process 200 used to form a printed circuit board 32 having integrated fuse protection is illustrated, in accordance with an embodiment of the invention. The process 200 begins at STEP 202 by providing an electrically insulating substrate 34 having a conductive trace substrate 36 on a first surface 50 thereof. The conductive trace substrate 36 may include a copper laminate coupled via an adhesive layer 38 to the electrically insulating substrate 34. The process 200 continues at STEP 204 by etching the conductive trace substrate 36 to form a circuit trace 40 with at least one fusible link 52 in the circuit trace 40, each of the at least one fusible links 52 comprising a portion of the circuit trace 40 having a reduced cross-sectional area from a first end 108 to a second end 110 of the respective fusible link 52. A portion of the circuit trace 40 may comprise a plurality of non-linear segments or portions (e.g. plurality of parallel curves) containing a plurality of fusible links 106. Each of the plurality of non-linear segments may be routed along closely spaced adjacent paths on the electrically insulating substrate 34.

In performing STEP 204, the conductive trace 40 may be etched into the conductive layer 36 using conventional photolithographic techniques. First, a layer of photoresist material (not shown) may be applied on the conductive layer 36. The desired geometry of the conductive trace 40 may be imaged onto the photoresist material using a mask or photolithographic art work, with the fusible links 42 also imaged onto the photoresist material. The unmasked photoresist material is cured, the unmasked photoresist material covers the desired geometry of the conductive trace 40 and fusible links 42. The cured photoresist material is developed, removing the uncured photoresist material exposing the copper layer 36. The cured photoresist material that remains on the desired conductive trace 40 and fusible links 42 provides protection during further processing. The exposed copper layer 36 may be removed from the electrically insulating substrate 34 by etching, preferably using a ferric chloride solution. The remaining cured photoresist is removed from the copper layer 36 leaving the desired circuit trace portions 48 with integrated fuses 42 formed on the electrically insulating substrate 34.

The process 200 continues at STEP 206 by forming a plurality of isolation gaps 94 through the electrically insulating substrate 34 such that each of the plurality of non-linear segments 68 is separated from another by one of the plurality of isolation gaps. The plurality of isolation gaps 94 may comprise a slot or slots formed (at least partially) through the electrically insulating substrate 34 that is/are configured to receive the dielectric encapsulant 60 covering the circuit trace 40. The process 200 continues at STEP 208 by forming one or more isolation gaps 64 through the electrically insulating substrate 34 substantially surrounding the plurality of non-linear segments 68, the circuit trace 40 routed on the electrically insulating substrate into an area surrounded by the isolation gap(s). The one or more isolation gaps 64 may comprise a pair of isolation gaps 78, 80 substantially surrounding the plurality of non-linear segments 68 of the circuit trace 40. Alternatively, any of the isolation gaps 64, 94 that are located around the isolation region 62 or between the plurality of non-linear segments 68 may be formed prior to the formation of the circuit trace 40.

The process 200 continues at STEP 210 by applying a dielectric encapsulant 60 on the electrically insulating substrate 34 to encapsulate each of the at least one fusible links 52. The dielectric encapsulant 60 may be applied on a side of the circuit trace 40 opposite the electrically insulating substrate 34 from the first end 108 to the second end 110 of each of the at least one fusible links 52. Each of the at least one fusible links 52 comprises a planar surface 58 on the side of the circuit trace 40 opposite the electrically insulating substrate 34 to receive the dielectric encapsulant 60 thereon. The dielectric encapsulant 60 can be easily applied to each fusible link 52 by encapsulating an area of the electrically insulating substrate 34 containing the plurality of non-linear segments 68. The dielectric encapsulant 60 preferably includes an epoxy or resin material with a high dielectric strength and volume resistivity. The dielectric encapsulant 60 may be configured to flow into the opened fusible link 124 upon the fusible link 52 receiving an electrical overage to prevent open circuit arcing between the first circuit trace portion 54 and the second circuit trace portion 56, with the dielectric encapsulant 60 preventing open circuit arcing across the fusible link 52 up to 600 volts.

Figure 7:
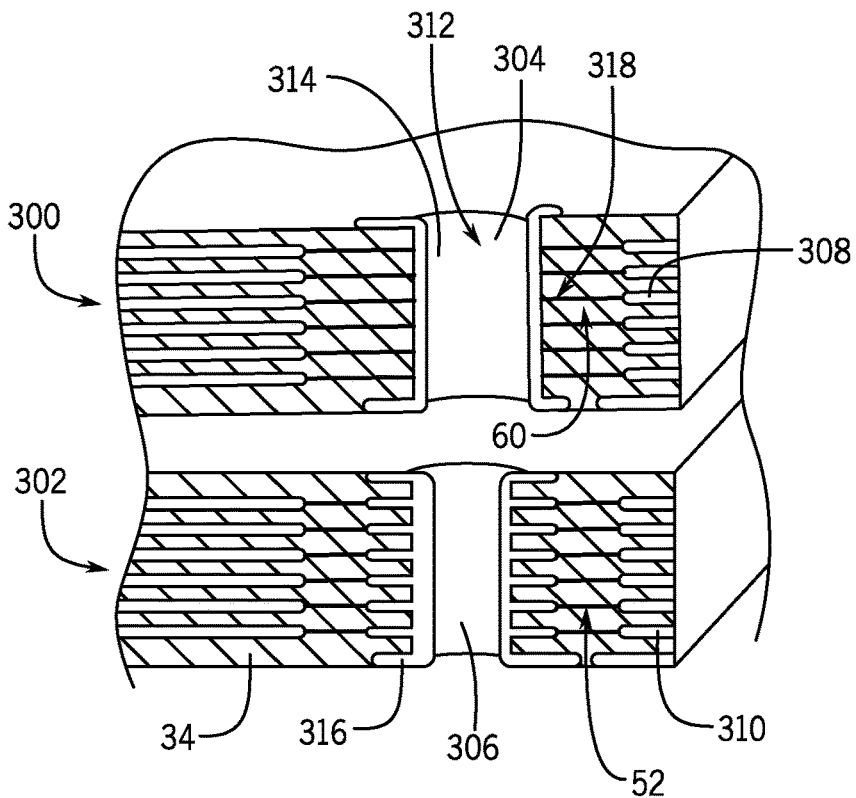
FIG. 7 is a cross-sectional view of a pair of multi-layer printed circuit boards having fuse protection, according to an embodiment of the invention.

Referring now to FIG. 7, a cross-sectional view of a pair of multi-layer printed circuit boards 300, 302 is shown, in accordance with an embodiment of the invention. The cross-sectional view is taken through a thru-hole via 304, 306 in each of the multi-layer printed circuit boards 300, 302 that provide electrical connections between layers in the respective boards. Each of the multi-layer printed circuit boards 300, 302 comprises one or more circuit traces 308, 310 formed on and/or within sheet layers of an electrically insulating substrate 34 in a stacked configuration. Each thru-hole via 304, 306 comprises a hole 312 formed through the multi-layer printed circuit board 300, 302 that is plated with an electrically conductive material 314. As such, each thru-hole via 304, 306 interconnects an electrical component(s) that is located on a first layer of the printed circuit board to an electrical component(s) located on a second layer. Conductive pads 316 may be formed on surfaces of one or more layers to connect the plated hole to electrical components on the respective layer (e.g. circuit traces, electrical fuses, etc.). Conductive pads 316 are shown located on outer layers of the first multi-layer circuit board 300 and the second multi-layer circuit board 302.

FIG. 7 shows the first multi-layer circuit board 300 with each layer having a circuit trace 308 coupled by an external fuse element 318 to the thru-hole via 304. FIG. 7 also shows the second multi-layer circuit board 302 with each layer having a circuit trace 310 with an internal fuse element 52. While an internal fuse element 52 may be formed within a circuit trace 310, an external fuse element 318 may be formed on the electrically insulating substrate 34 independently from a circuit trace 308. Rather than etched into a conductive trace, for instance, the external fuse element 318 could be deposited separately on the thru-hole via 304/ electrically insulating substrate 34 to connect the circuit trace 308. The dielectric encapsulant 60 may be formed on a planar surface of an external fuse element 318 to form an arcless fuse formed on the thru-hole via 304. In another embodiment of the invention, an external fuse element may be formed on the thru-hole via 304 to connect circuit traces 308 formed on different layers. For instance, an external fuse element may be formed on an inner surface of the thru-hole 312 to connect a circuit trace 308 on one layer of the board 300 to a circuit trace on another layer of the board. A dielectric encapsulant could encapsulate an external fuse element on the inner surface of the thru-hole 312 to electrically isolate the circuit traces 308 connected by the external fuse element from the thru-hole via 304.

Beneficially, embodiments of the invention provide a printed circuit board having integrated thin film fusing with arc suppression. The printed circuit board may include a conductive trace formed on an electrically insulating substrate to form an electrical circuit. One or more fuse elements each having a planar surface may be formed in the conductive trace, with each of the one or more fuse elements configured to open the electrical circuit upon receiving an electrical overage. The printed circuit board may also include a dielectric encapsulant formed on the planar surface of each of the one or more fuse elements to prevent open circuit arcing by reflow into a respective open fuse element. That is, as the fuse element heats to its thermal meting point the encapsulated high dielectric material reflows around the open fused element thus preventing open arcing. Accordingly, the dielectric reflow allows the fuse element to open in an over current event, yet avoid arcing in a short-circuit event.

Therefore, according to one embodiment of the invention, a circuit board with integrated fusing includes an insulating substrate having a circuit trace formed on a surface thereof, the circuit trace including a first circuit trace portion and a second circuit trace portion. A fusible link electrically connects the first circuit trace portion to the second circuit trace portion, the fusible link including a planar surface extending from the first circuit trace portion to the second circuit trace portion. A dielectric reflow encapsulates the fusible link on the planar surface from the first circuit trace portion to the second circuit trace portion.

According to another embodiment of the invention, a circuit board with integrated fusing includes an electrically insulating substrate, a conductive trace formed on the electrically insulating substrate to form an electrical circuit, and one or more fuse elements positioned in the conductive trace. Each of the one or more fuse elements may be configured to open the electrical circuit upon receiving an electrical overage. A dielectric encapsulant is positioned about each of the one or more fuse elements to prevent open circuit arcing by reflow into a respective open fuse element.

According to yet another embodiment of the invention, a method of forming a printed circuit board includes providing an electrically insulating substrate having a conductive trace substrate on a first surface thereof, and etching the conductive trace substrate to form a circuit trace with at least one fusible link in the circuit trace. Each of the at least one fusible link includes a portion of the circuit trace having a reduced cross-sectional area from a first end to a second end of the respective fusible link. The method also includes applying a dielectric on the circuit trace so as to encapsulate each of the at least one fusible link from the first end to the second end.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A circuit board with integrated fusing comprising:
    an electrically insulating substrate;
    a conductive trace formed on the electrically insulating substrate to form an electrical circuit;
    one or more fuse elements positioned in the conductive trace, each of the one or more fuse elements configured to open the electrical circuit upon receiving an electrical overage; and
    a dielectric encapsulant positioned about each of the one or more fuse elements to prevent open circuit arcing by reflow into a respective open fuse element,
    wherein a portion of the conductive trace comprises a non-linear configuration, with a plurality of segments of the portion arranged in an adjacent relationship to one another, and
    wherein the one or more fuse elements comprise a plurality of fuse elements positioned in the plurality of segments, the plurality of fuse elements being serially arranged.

2. The circuit board with integrated fusing of claim 1, wherein the plurality of segments of the conductive trace form a spiral portion of the conductive trace.

3. The circuit board with integrated fusing of claim 1, wherein the dielectric encapsulant covers the non-linear portion of the conductive trace.

4. The circuit board with integrated fusing of claim 3, further comprising one or more isolation gaps formed in the electrically insulating substrate and separating each of the plurality of segments of the conductive trace, and
    wherein the dielectric encapsulant extends into each isolation gap.

5. The circuit board with integrated fusing of claim 4, wherein the plurality of segments of the conductive trace are formed on an isolation region of the electrically insulating substrate, the isolation region substantially surrounded by one or more openings formed in the electrically insulating substrate, with the conductive trace routed into the isolation region, and
    wherein the dielectric encapsulant extends into each of the one or more openings to encapsulate the isolation region.

6. The circuit board with integrated fusing of claim 1, wherein the circuit trace comprises a metal laminate coupled to the surface of the electrically insulating substrate by an adhesive.

7. The circuit board with integrated fusing of claim 1, wherein at least one of the one or more fuse elements comprises a first material and the conductive trace comprises a second material, and the first and second materials are different materials.

8. The circuit board with integrated fusing of claim 7, wherein the first material has a lower thermal melting temperature than the second material.

9. The circuit board with integrated fusing of claim 1, wherein the circuit board further comprises a plurality of isolation gaps that separate each of the plurality of segments of the conductive trace.

10. The circuit board with integrated fusing of claim 9, wherein at least some of the plurality of segments of the conductive trace form a spiral portion of the conductive trace.

11. The circuit board with integrated fusing of claim 1, wherein each of the one or more fuse elements comprises a planar surface, and the dielectric encapsulant is on the planar surface.

12. The circuit board with integrated fusing of claim 1, wherein at least one of the one or more fuse elements comprises a planar surface.

13. The circuit board with integrated fusing of claim 12, wherein the planar surface is positioned on a side of the fuse element that is opposite the electrically insulating substrate.

14. The circuit board with integrated fusing of claim 13, wherein the planar surface is planar to a surface of the conductive trace.

15. The circuit board with integrated fusing of claim 1, wherein each fuse element extends between a first circuit trace portion and a second circuit trace portion and is configured to open due to resistive heating resulting from an electrical overage; and
    wherein the dielectric encapsulant flows into the open fuse element to prevent open circuit arcing between the first circuit trace portion and the second circuit trace portion.

16. The circuit board with integrated fusing of claim 1, wherein the reflow prevents open circuit arcing up to 600 volts.

17. The circuit board with integrated fusing of claim 1, wherein the dielectric encapsulant comprises an epoxy resin based high dielectric potting material.

18. The circuit board with integrated fusing of claim 1, wherein at least one of the one or more fuse elements extends from a first circuit trace portion and a second circuit trace portion and has a smaller cross-sectional area than both the first circuit trace portion and the second circuit trace portion.

19. The circuit board with integrated fusing of claim 1, wherein each of the one or more fuse elements comprises a planar surface.

20. The circuit board with integrated fusing of claim 12, wherein the conductive trace comprises a periphery, and the planar surface extends beyond the periphery.

\* \* \* \* \*